(12) United States Patent
Kerstenbeck

(10) Patent No.: US 7,720,469 B2
(45) Date of Patent: May 18, 2010

(54) FREQUENCY CALIBRATION OF WIRELESS TELECOMMUNICATION DEVICE

(75) Inventor: Erik Olaf Kerstenbeck, Ramona, CA (US)

(73) Assignee: Nokia Corporation, Espoo (FI)

( * ) Notice: Subject to any disclaimer, the term of this patent is extended or adjusted under 35 U.S.C. 154(b) by 378 days.

(21) Appl. No.: 11/321,331

(22) Filed: Dec. 29, 2005

(65) Prior Publication Data

US 2007/0155413 A1 Jul. 5, 2007

(51) Int. Cl.
*H04M 11/00* (2006.01)

(52) U.S. Cl. .................... 455/423; 455/296; 455/456.6; 455/320; 455/69; 455/136; 455/164.2; 455/255; 455/260; 370/342; 370/346; 370/320; 370/356; 370/401; 370/468; 370/419; 370/257

(58) Field of Classification Search .................. 455/296, 455/73, 456.6, 69, 226.1, 136, 164.2, 255, 455/260, 456, 320, 357, 67.11, 63.1, 434, 455/196.1; 370/320, 342, 346, 356, 392, 370/401, 468, 252, 338, 419, 257
See application file for complete search history.

(56) References Cited

U.S. PATENT DOCUMENTS

| | | | | |
|---|---|---|---|---|
| 6,041,222 | A * | 3/2000 | Horton et al. ................ | 455/255 |
| 6,122,261 | A * | 9/2000 | Fernandes et al. ........... | 370/320 |
| 6,668,164 | B2 * | 12/2003 | Hughes ................... | 455/234.1 |
| 6,757,527 | B1 * | 6/2004 | Dahlback et al. ............ | 455/255 |
| 6,795,695 | B1 * | 9/2004 | Brekelmans et al. ...... | 455/192.2 |
| 7,295,821 | B2 * | 11/2007 | Yuan ....................... | 455/164.2 |
| 2003/0119503 | A1 * | 6/2003 | Shohara et al. ............ | 455/434 |
| 2004/0198277 | A1 * | 10/2004 | Yuan .......................... | 455/136 |
| 2004/0213355 | A1 * | 10/2004 | Morton et al. .............. | 375/289 |
| 2005/0118970 | A1 * | 6/2005 | Nara ....................... | 455/226.1 |
| 2005/0181810 | A1 * | 8/2005 | Camp et al. .............. | 455/456.6 |
| 2005/0186933 | A1 * | 8/2005 | Trans ......................... | 455/296 |
| 2005/0195105 | A1 * | 9/2005 | McBurney et al. ....... | 342/357.1 |
| 2005/0221765 | A1 * | 10/2005 | Shen et al. .................... | 455/73 |
| 2005/0225415 | A1 * | 10/2005 | Mahony et al. .............. | 335/302 |
| 2005/0225433 | A1 * | 10/2005 | Diorio et al. ............... | 340/10.4 |
| 2006/0104394 | A1 * | 5/2006 | Chan et al. .................. | 375/344 |
| 2006/0223440 | A1 * | 10/2006 | Stockton .................... | 455/63.1 |
| 2006/0229026 | A1 * | 10/2006 | Lynch .......................... | 455/69 |
| 2007/0071006 | A1 * | 3/2007 | Bosch et al. ................ | 370/392 |

* cited by examiner

*Primary Examiner*—Rafael Pérez-Gutiérrez
*Assistant Examiner*—Joseph Arevalo
(74) *Attorney, Agent, or Firm*—Hollingsworth & Funk, LLC

(57) ABSTRACT

A wireless telecommunication device, a method of frequency calibrating a wireless telecommunication device, and a computer program are provided. The method comprises: receiving a reference radio signal of the wireless telecommunications system; frequency synchronizing the wireless telecommunication device with the reference radio signal by adjusting a control parameter controlling a reference frequency generated by a reference frequency generator; measuring a temperature parameter characterizing the temperature of the reference frequency generator; and generating calibration information for calibrating the wireless telecommunication device on the basis of the control parameter and the temperature parameter.

12 Claims, 5 Drawing Sheets

FREQUENCY CALIBRATION OF WIRELESS TELECOMMUNICATION DEVICE

The invention relates to a wireless telecommunication device of a wireless telecommunication system, a method of frequency calibrating a wireless telecommunication device and a computer program for frequency calibrating a wireless telecommunication device.

BACKGROUND

With today's increasingly crowded communications spectrum, the need for high performance frequency references of wireless communication devices is increasing. Thermal effects in wireless telecommunication devices give rise to instability in frequency reference and the communication radio frequencies generated from the frequency reference, thus reducing the overall performance of the wireless telecommunications system.

Wireless telecommunication devices are typically calibrated at a manufacturing stage of a reference frequency generator providing the frequency reference. However, due to the strict frequency requirements of the telecommunication radio interface and a required simplicity of the frequency control system, it is useful to consider advanced techniques for frequency calibrating a wireless telecommunication device.

BRIEF DESCRIPTION OF THE INVENTION

An object of the invention is to provide an improved wireless telecommunication device, a method and a computer program.

According to a first aspect of the invention, there is provided a wireless telecommunication device of a wireless telecommunication system, comprising: a receiver configured to receive a reference radio signal of the wireless telecommunications system; a reference frequency generator configured to generate a reference frequency for the wireless telecommunication device on the basis of a control parameter; a frequency synchronizer, connected to the receiver, configured to frequency synchronize the wireless telecommunication device with the reference radio signal by adjusting the control parameter; a temperature measurement unit configured to measure a temperature parameter characterizing the temperature of the reference frequency generator; and a calibration unit, connected to the temperature measurement unit, configured to generate calibration information on the basis of the control parameter and the temperature parameter and to store the calibration information.

According to a second aspect of the invention, there is provided a wireless telecommunication device of a wireless telecommunication system, comprising: receiving means for receiving a reference radio signal of the wireless telecommunications system; frequency synchronizing means for frequency synchronizing the wireless telecommunication device with the reference radio signal by adjusting a control parameter controlling a reference frequency generated by a reference frequency generator; measuring means for measuring a temperature parameter characterizing the temperature of the reference frequency generator; and generating means for generating calibration information for calibrating the wireless telecommunication device on the basis of the control parameter and the temperature parameter.

According to a third aspect of the invention, there is provided a method of frequency calibrating a wireless telecommunication device, the method comprising: receiving a reference radio signal of the wireless telecommunications system; frequency synchronizing the wireless telecommunication device with the reference radio signal by adjusting a control parameter controlling a reference frequency generated by a reference frequency generator; measuring a temperature parameter characterizing the temperature of the reference frequency generator; and generating calibration information for calibrating the wireless telecommunication device on the basis of the control parameter and the temperature parameter.

According to another aspect of the invention, there is provided a computer program for frequency calibrating a wireless telecommunication device, the computer program encoding instructions for executing a computer process in a digital processor, the computer process comprising: frequency synchronizing the wireless telecommunication device with a received reference radio signal by adjusting a control parameter controlling a reference frequency generated by a reference frequency generator; and generating calibration information for calibrating the wireless telecommunication device on the basis of the control parameter and the temperature parameter characterizing the temperature of the reference frequency generator.

The invention provides several advantages.

In an embodiment of the invention, the invention enables an accurate reference frequency to be generated prior to a frequency synchronization procedure, thus accelerating connection formation, for example, when the wireless telecommunication is switched on.

LIST OF DRAWINGS

In the following, the invention will be described in greater detail with reference to embodiments and accompanying drawings, in which FIG. 1 shows an example of the structure of a wireless telecommunication device;

DESCRIPTION OF EMBODIMENTS

Figure 1:
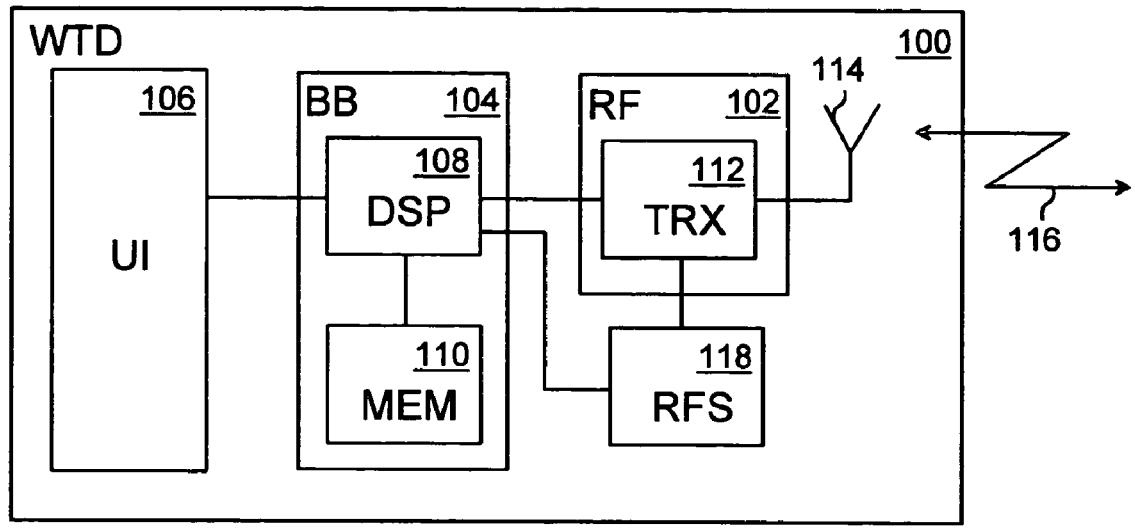

With reference to FIG. 1, examine an example of a structure of a wireless telecommunication device (WTD) 100. The wireless telecommunication device 100 may also be referred to as a mobile phone, a cellular phone, user equipment, a mobile station, a mobile terminal and/or a wireless telecommunication modem. The present solution is not, however, restricted to listed devices, but may be applied to any wireless telecommunication device connectable to a wireless telecommunication network.

The wireless telecommunication network may be based on the following radio access technologies: GSM (Global System for Mobile Communications), GERAN (GSM/EDGE Radio access network), GPRS (General Packet Radio Service), E-GPRS (EDGE GPRS), UMTS (Universal Mobile Telecommunications System), CDMA2000 (CDMA, Code Division Multiple Access), US-TDMA (US Time Division Multiple Access) and TDS-CDMA (Time Division Synchronization CDMA). The invention is not, however, restricted to listed radio access technologies, but may be applied to a wireless telecommunication device of any wireless telecommunication network.

The wireless telecommunication device 100 includes a base band domain (BB) 104 and a radio frequency domain (RF) 102. The base band domain 104 comprises a digital signal processor (DSP) 108 and a memory unit (MEM) 110 connected to the digital signal processor 108.

The digital signal processor 108 and the memory unit 110 typically form a part of the computer of the cellular telecommunication device 100. The presented division of the wireless telecommunication device 100 into the base band domain 102 and the radio frequency domain 102 is provided for the ease of discussion and does not restrict embodiments of the invention to a divided structure.

The radio frequency domain 102 typically comprises a transceiver (TRX) 112 and an antenna 114 which together implement the radio interface 116 of the wireless telecommunication network. The transceiver 112 includes a transmit chain not shown in FIG. 1, for transforming base band transmit signals into a radio frequency transmit signals. The transmit chain comprises, for example, an up-converter for converting the base band transmit signal into a radio frequency.

The transceiver 112 also comprises a receive chain not illustrated in FIG. 1, for receiving radio frequency receive signals from the radio interface 116 and for transforming the radio frequency receive signals into base band receive signals. The receive chain comprises, for example, a down-converter for converting the radio frequency receive signal into a base band frequency.

The wireless telecommunication device 100 further comprises a radio frequency source (RFS) 118, which generates reference radio frequencies, such as a local oscillator frequency, for the up-converters and down-converters of the transceiver 112.

The wireless telecommunication device 100 may further include a user interface (UI) 106, which provides the user with means for communicating with the wireless telecommunication device 100. The user interface 106 may comprise an audiovisual interface and a keypad, for example.

Figure 2:
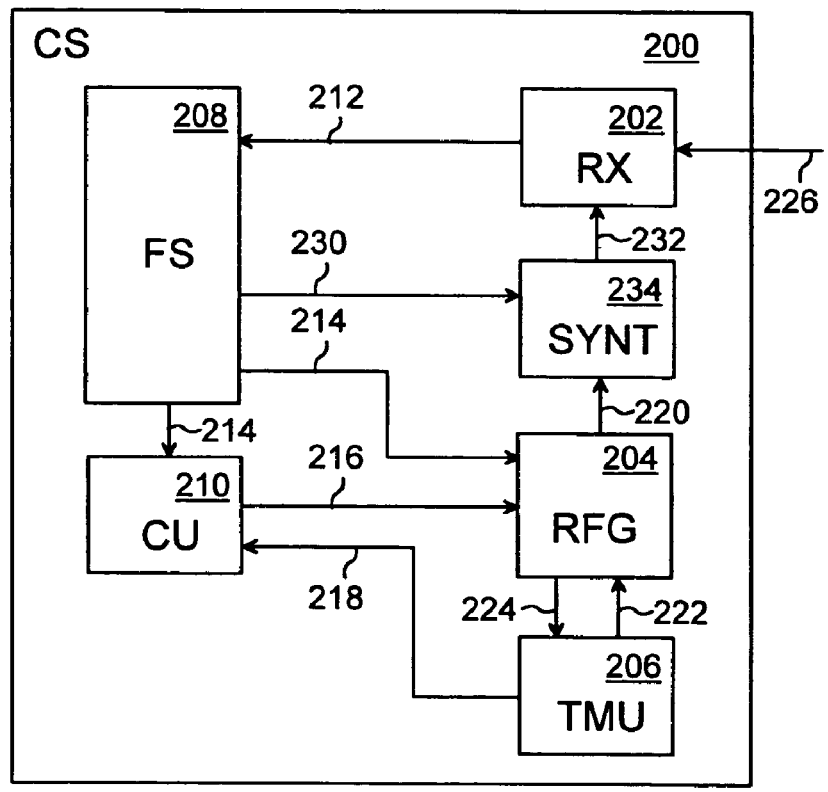
FIG. 2 illustrates an example of a calibration system according to an embodiment of the invention.

With reference to the example shown in FIG. 2, a calibration system (CS) 200 comprises a receiver (RX) 202, a frequency synchronizer (FS) 208 connected to the receiver 202, a reference frequency generator (RFG) 204 operationally connected to the receiver 202, a calibration unit (CU) 210 and a temperature measurement unit (TMU) 206. Furthermore, a frequency synthesizer (SYNT) 234 is shown between the receiver 202 and the reference frequency generator 204. The reference frequency generator 204 and the frequency synthesizer 234 may be comprised in the radio frequency source 118 of FIG. 1.

The receiver 202 receives a reference radio signal 226 of the wireless telecommunications system. The reference radio signal 226 may be generated in a base station or a base station emulator, a test facility or in a process line, for example.

The reference radio signal 226 may be a pilot signal or a pilot channel, which provides an external radio frequency reference and possibly phase reference for the wireless telecommunication device 100.

The reference radio signal 226 is down-converted into a base band signal 212 and inputted into the frequency synchronizer 208. A down-conversion is typically carried out by mixing the reference radio signal 226 with a local oscillator signal 232 generated in the frequency synthesizer 234.

The receiver 202 may comprise analogue-to-digital converters for converting the base band signal 212 from an analogue format into a digital format.

The radio frequency synthesizer 234 generates the local oscillator signal 232 and feeds the local oscillator signal 232 into the transceiver 112. The radio frequency synthesizer 234 may comprise a phase-locked loop (PLL) that is known as a feedback system for generating the local oscillator signal 232 with accurate and stable signal characteristics, such as frequency and phase.

The radio frequency synthesizer 234 is typically provided with a synthesizer control signal 230 by the frequency synchronizer 208. The synthesizer control signal 230 typically includes control information, such as a frequency multiplication factor applied by the phase locked loop, for adjusting the frequency of the local oscillator signal 232.

The wireless telecommunication device 100 may include a plurality of radio frequency synthesizers 234, each producing a different radio frequency for a down-converter and/or an up-converter. Furthermore, a radio frequency synthesizer 234 may be dedicated to generating intermediate frequencies for an intermediate frequency domain and/or direct conversion systems.

The radio frequency synthesizer 234 is provided with frequency reference 220 by the reference frequency generator 204. The frequency of the local oscillator signal 232 is typically a multiple of the frequency reference 220. The ratio of the frequency of the local oscillator signal 232 to the frequency reference 220 is typically controlled with the synthesizer control signal 230.

The reference frequency generator 204 may generate the reference frequency 220 for the wireless telecommunication device 100 on the basis of a control parameter 214 generated by the frequency synchronizer 208.

The reference frequency generator 204 typically comprises a resonator structure, which is sensitive to the temperature of the reference frequency generator 204. The temperature of the wireless telecommunication device 100 varies due to environmental thermal changes and internal heat formation. As a result, the frequency reference 220, and thus the local oscillator frequency 232 depend on the current temperature of the reference frequency generator 204.

In an embodiment of the invention, the reference frequency generator is a VCTCXO (Voltage Controlled Temperature-compensated Crystal Oscillator).

The control parameter 214 generated by the frequency synthesizer 208 and/or the calibration unit 210 may include information on a control voltage providing a desired reference frequency 220, a desired frequency shift to the reference frequency 220 or another quantity affecting the frequency reference 220. The control parameter 214 may be transmitted to the reference frequency generator 204 in a digital or an analogue format.

The temperature measurement unit 206 measures a temperature parameter characterizing the temperature of the reference frequency generator 204.

In an embodiment of the invention, the temperature measurement unit 206 comprises a thermal sensor, such as a thermally sensitive semiconductor, whose electric characteristics have thermal dependence. The thermal sensor may be external or internal to the reference frequency generator 204.

The temperature measurement unit 206 generates a temperature parameter 218 characterizing the temperature of the reference frequency generator 204.

The frequency synchronizer 208 receives the base band signal 212 and synchronizes the wireless telecommunication device 100 with the reference radio signal 216 by adjusting the control parameter 214 fed into the reference frequency generator 204.

The frequency synchronizer 208 may utilize a Fast Fourier Transform (FFT) method. An example of such a method is disclosed in a U.S. Pat. No. 6,006,880 which is thereby incorporated by reference.

The frequency synchronizer 208 outputs the control parameter 214, such as a frequency offset or a control voltage into the reference frequency generator 204, which adjusts the reference frequency 220 accordingly. The control parameter 214 may also be referred to as an automatic frequency control parameter.

The control parameter 214 and a temperature parameter 218 are inputted into the calibration unit 210, which generates calibration information on the basis of the control parameter 214 and the temperature parameter 218. The calibration information is stored into the calibration unit 210.

In an embodiment of the invention, the reference frequency generator 204 may communicate the control parameter 224 to the temperature measurement unit 206. The temperature measurement unit 206 may communicate the temperature parameter 222 to the reference frequency generator 204.

The calibration information may be generated at synchronized state, i.e., when the wireless telecommunication device 100 has been frequency synchronized with the reference radio signal 216. The synchronized state may be explicitly indicated to the calibration unit 210, for example, with a flag signal inputted into the calibration unit 210. In another embodiment, the synchronized state is implicitly indicated by starting the input of the control parameters 214 into the calibration unit 210.

When the calibration information is available, the calibration unit 210 may output a temperature-compensated control parameter 216 corresponding to a temperature parameter 218 to the reference frequency generator 204 as a response to an input of the temperature parameter 218. In this case, the temperature-compensated control parameter 216 replaces the control information 214 from the frequency synchronizer 208.

The reference frequency generator 204 adjusts the frequency reference 220 on the basis of the temperature-compensated control parameter 216.

The use of the temperature-compensated control parameter 216 compensates for the temperature effects in the reference frequency generator 204 by applying temperature predetermined characteristics of the reference frequency oscillator 204, thus reducing the need for frequency synchronization. The use of the temperature-compensated control parameter 216 enables an accurate frequency reference to be generated when the frequency synchronization procedure has not yet been completed, thus reducing the time needed for connection formation. A frequency synchronizer 208 may be implemented with the digital signal processor 108 and software executed in the digital signal processor 108 and stored in the memory unit 110. Some parts of the frequency synchronizer 208 may be implemented with ASICs (Application-Specific Integrated Circuit).

The calibration unit 210 may be implemented with the digital signal processor 108 and software executed in the digital signal processor 108 and stored in the memory unit 110.

In an embodiment of the invention, the reference frequency generator 204 comprises an AT-cut crystal resonator. The AT-cut crystal resonator provides an inexpensive resonator structure suitable for wireless telecommunication devices, whose manufacturing cost is a critical parameter.

Calibration information of an AT-cut crystal resonator may be characterized with a third order temperature response curve $$P = a_1 T + a_2 T^2 + a_3 T^3, \quad (1)$$

where P is the control parameter 220 at current temperature T, and $a_1$, $a_2$ and $a_3$ are parameters characterizing the AT-cut crystal resonator. The control parameter P may be a control voltage or a frequency shift, for example. Parameters $a_1$, $a_2$ and $a_3$ may also be referred to as calibration parameters.

Figure 3:
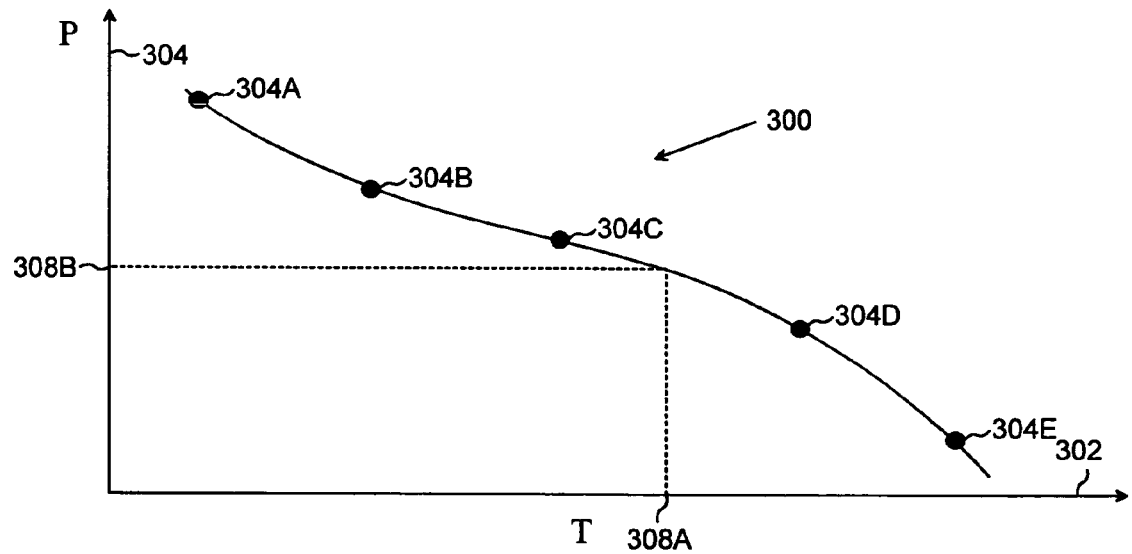
FIG. 3 illustrates an example of a calibration curve.

FIG. 3 shows an example of a calibration curve 300. A horizontal axis 302 shows the temperature of the reference frequency generator 204 while a vertical axis 304 shows a value of the control parameter 214.

The calibration curve 300 may be defined by calibration points 304A to 304E, each associating a control parameter 214 with a temperature parameter 218.

In an embodiment of the invention, the calibration information comprises the calibration points 304A to 304E as such and/or calibration parameters, such as $a_1$, $a_2$ and $a_3$, which characterize the calibration curve 300.

A calibration procedure comprises a series of measurements of temperature parameters 218 and determination of control parameters 214. The calibration information may be generated and stored at a given temperature interval, such as 10 degrees centigrade.

The calibration procedure may take place during the normal use of the wireless telecommunication device 100. In an embodiment of the invention, the calibration procedure is carried out during a manufacture process of the wireless telecommunication device 100.

Figure 4:
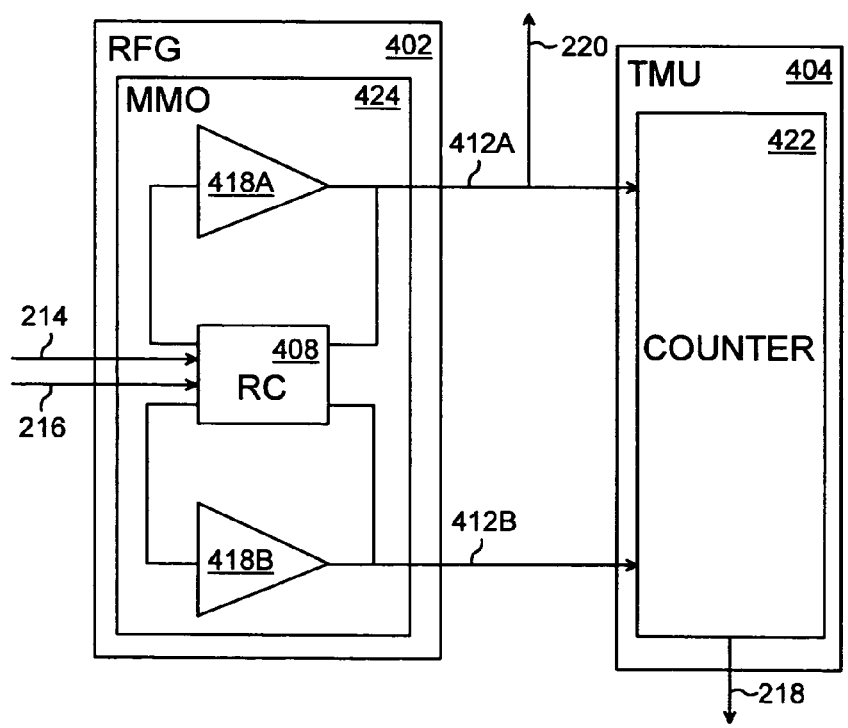
FIG. 4 illustrates an example of a reference frequency generator and a temperature measurement unit according to an embodiment of the invention.

With reference to FIG. 4, in an embodiment of the invention, the reference frequency generator (RFG) 402 generates a first frequency 412A and a second frequency 412B simultaneously. The first frequency 412A has a first response to the temperature of the frequency generator 402 while the second frequency 412B has a second response to the temperature of the frequency generator 402. The second response is different from the first response, i.e., there is no a linear relationship between the second response and the first response.

FIG. 4 shows a multi-mode oscillator (MMO) 424 comprising a resonator crystal 408, such as an AT-cut crystal, coupled with amplifying units 418A, 418B. A first amplifying unit 418A, 418B is adjusted to amplify the first frequency 412A while a second amplifying unit 418B is adjusted to amplify the second frequency 412B.

In an embodiment of the invention, the first frequency 412A and the second frequency 412B are the fundamental frequency and the third overtone frequency, respectively, of an AT-cut crystal resonator.

The first frequency 412A and the second frequency 412B are inputted into the temperature measurement unit (TMU) 404, which generates the temperature parameter 218 on the basis of the first frequency 412A and the second frequency 412B.

The frequency generator 202, 402 may be implemented with an RF ASIC (Application-Specific Integrated Circuit), such a transmitter ASIC or receiver ASIC.

In an embodiment of the invention, the temperature measurement unit 404 determines the temperature parameter 218 as a difference between the third overtone frequency $f_{3ovtr}$ and three times the fundamental frequency $3 f_{fun}$. In this case, the temperature parameter 218 may also be referred to as a beat frequency $f_b$ written as $$f_b \propto 3 \times f_{fun} - f_{3ovtr}. \qquad (2)$$

When assuming a calibration curve of the form of Equation (1) and taking an inflection point temperature of an AT-crystal as a reference temperature, a deviation $\Delta T$ of the current temperature T from the inflection point temperature is nearly linearly proportional to the beat frequency, i.e.

$$\Delta T = (T - T_{inf}) = A \times f_b. \qquad (3)$$

where A is a conversion parameter. Equation (3) indicates that the beat frequency may be used as a temperature parameter 218.

Equations (1) and (3) give rise to a relationship between the beat frequency $f_b$ and the control parameter P, i.e.

$$P = P(f_b) = a_1 A f_b + a_3 (A f_b)^3. \qquad (4)$$

With further reference to FIG. 4, the temperature measurement unit 404 may comprise a counter 422, which determines the temperature parameter 218 on the basis of a count of pulses associated with the first frequency 412A and pulses associated with the second frequency 412B. The counter 422 may be based on a down-count binary counter.

The down-count binary counter may utilize the fundamental frequency 412A as a clock frequency. The down-count binary counter may be preloaded with initial value −3B, where B is a product of a counting period and the clock frequency. The down-count binary counter starts counting pulses associated with the third overtone frequency. Each pulse subtracts 1 from the preloaded value 3B. At the end of the counting period, the beat frequency is obtained as a different between the preloaded value of 3B and the sum of the pulses associated with the third overtone frequency. The beat frequency is latched and made available to the calibration unit 210. In terms of a mathematical representation, the beat frequency may be written as $$f_b = \frac{1}{T_c}(3P - f_{3ovrt}T_c), \qquad (5)$$

where $T_c$ is the counting period.

The adjustment of the frequency reference 220 is typically realized with a control voltage applied to the resonator crystal 408 of the reference frequency generator 402. Thereby, the calibration curve may be written as $$\Delta V_T = \Delta V_T(f_b), \qquad (6)$$

where $\Delta V_T$ is the change in the control voltage as a function of the beat frequency. The control voltage of Equation (6) may represent the physical potential difference applied to the resonator crystal 408 or a value proportional to the control voltage before a digital-to-analogue conversion.

The counter 422 may be implemented with a logical circuit and/or an algorithm executed in the digital signal processor 108.

The reference frequency generator 402 may partially be integrated into a radio frequency integrated circuit. In an embodiment of the invention, the reference frequency generator 402 is integrated into a receiver 202. The resonator crystal may be located outside the radio frequency integrated circuit.

The temperature measurement unit 206 of FIG. 1 may be implemented outside the radio frequency integrated circuit.

Figure 5:
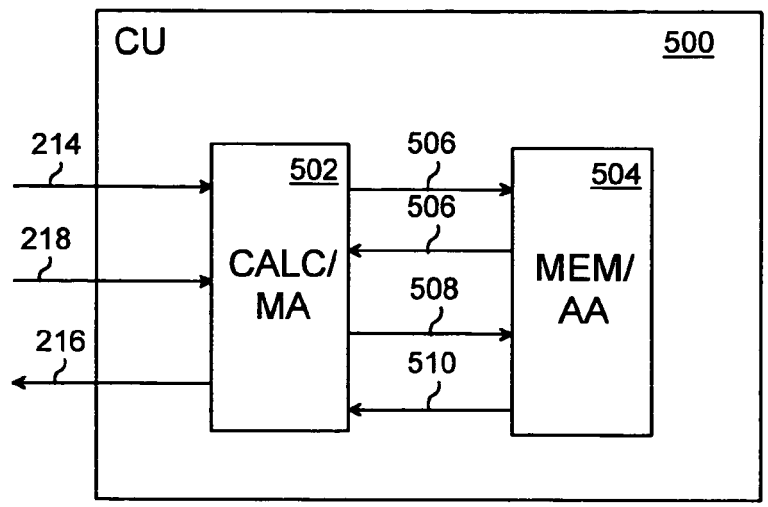
FIG. 5 illustrates an example of a calibration unit according to an embodiment of the invention.

With reference to FIG. 5, the calibration unit 500 may comprise a calculation/memory access unit 502 (CALC/MA) and a memory/associative array (MEM/MAA) 504. The calculation/memory access unit 502 receives the control parameter 214 from the frequency synchronizer 208 and the temperature parameter 218 from the temperature measurement unit 206. The control parameter 214 and the temperature parameter 218 provide a calibration point 304A to 304B of the calibration curve 300.

The memory/associative array 504 may comprise an associative data structure where a memory address is associated with a calibration parameter.

In an embodiment of the invention, the calculation/memory access unit 502 determines calibration parameters 506, such as those shown in Equation (1), from the temperature parameter 218 and the control parameter 214 and stores the calibration parameters 506 into the memory/associative array 504. When a request for determining the control parameter 308B at an arbitrary temperature 308A is inputted into the calibration unit 500, the calculation/memory access unit 502 may retrieve the calibration parameters 506 from the memory/associative array 504 and calculate the value of the temperature-compensated control parameter 216. The temperature-compensated control parameter 216 is outputted into the reference frequency generator 204 which adjusts the frequency reference 220 accordingly.

A set of calibration parameters 506 may be obtained by using a model calibration curve 300, such as that shown in Equation (1) and by fitting the model calibration curve 300 against measured calibration points 304A to 304E.

In another embodiment of the invention, the calculation/memory access unit 502 inputs calibration points 508 corresponding to calibration points 304A to 304B of the calibration curve 300 into the memory/associative array 504. A temperature parameter 218 may be converted into a memory address of the memory/associative array 504 so that each temperature-compensated control parameter 216 is associated with a specific memory address. A data structure described may also be referred to as a look-up table.

When a request for determining the control parameter 308B at an arbitrary temperature 308A is inputted into the calibration unit 500, the calculation/memory access unit 502 reads a memory address corresponding to the arbitrary temperature 308A. If the contents of the memory address are available, the calculation/memory access unit 502 reads the control parameter 510 from the memory address and inputs the temperature-compensated control parameter 216 into the reference frequency generator 204. If the control parameter 308B corresponding to the arbitrary temperature 308A is not available, the calculation/memory access unit 502 may retrieve control parameters around an expected control parameter and calculate the temperature-compensated control parameter 216 by using retrieved control parameters and an interpolation procedure.

Figure 6:
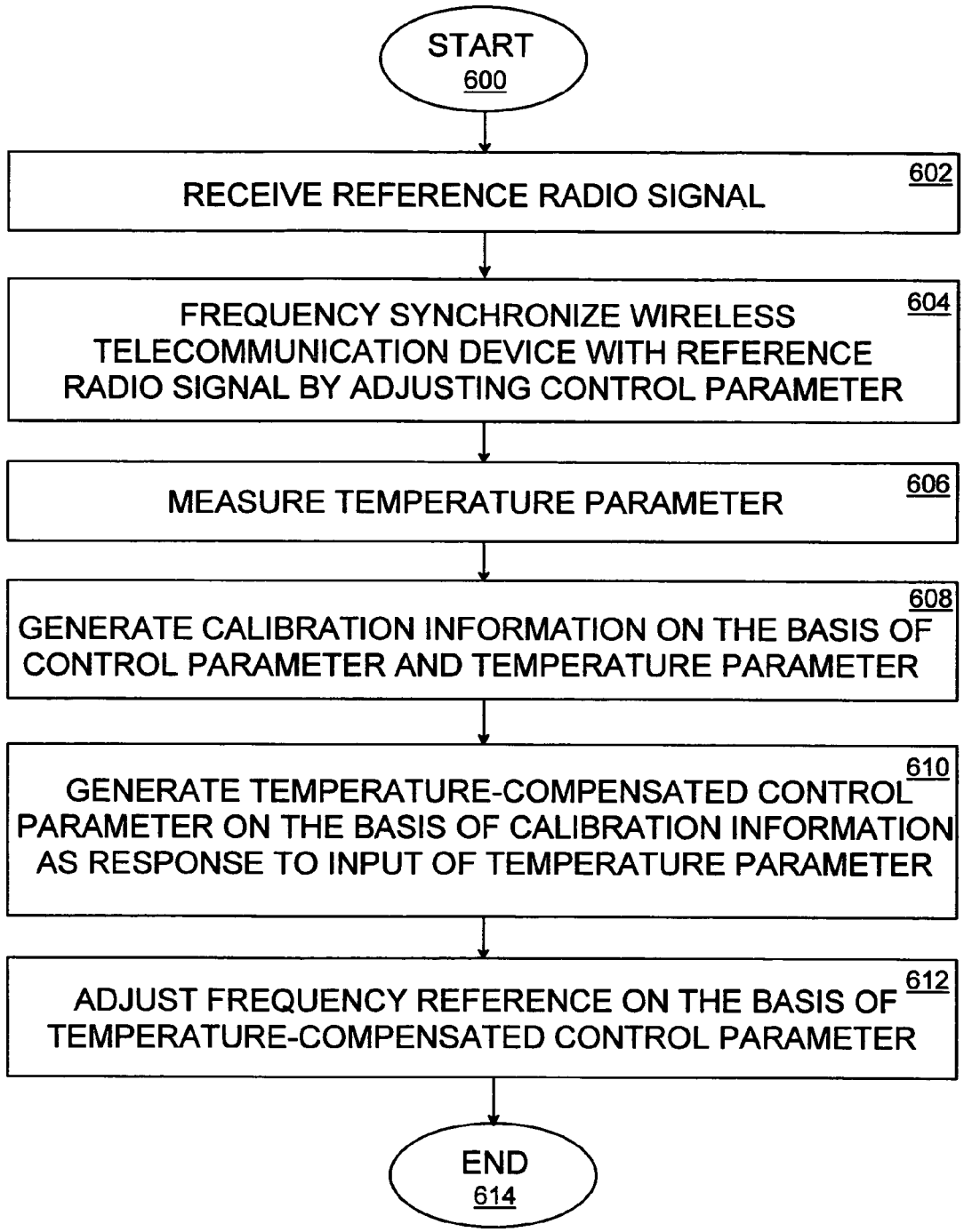
FIG. 6 illustrates a first example of a methodology according to an embodiment of the invention.

With reference to FIG. 6, a methodology according to embodiments of the invention is shown with a flow chart.

In 600, the method starts.

In 602, a reference radio signal 226 of the wireless telecommunications system is received.

In 604, the wireless telecommunication device 100 is frequency synchronized with the reference radio signal 226 by adjusting a control parameter 214 controlling a reference frequency 220 generated by a reference frequency generator 204.

In 606, a temperature parameter 218 characterizing the temperature of the reference frequency generator 204 is measured.

In 608, calibration information for calibrating the wireless telecommunication device 100 is generated on the basis of the control parameter 214 and the temperature parameter 218.

In 610, according to an embodiment, a temperature-compensated control parameter 216 is generated on the basis of the calibration information as a response to an input of a temperature parameter 218.

In 612, according to an embodiment, the frequency reference 220 is adjusted on the basis of the temperature-compensated control parameter 216.

In 614, the method ends.

Figure 7:
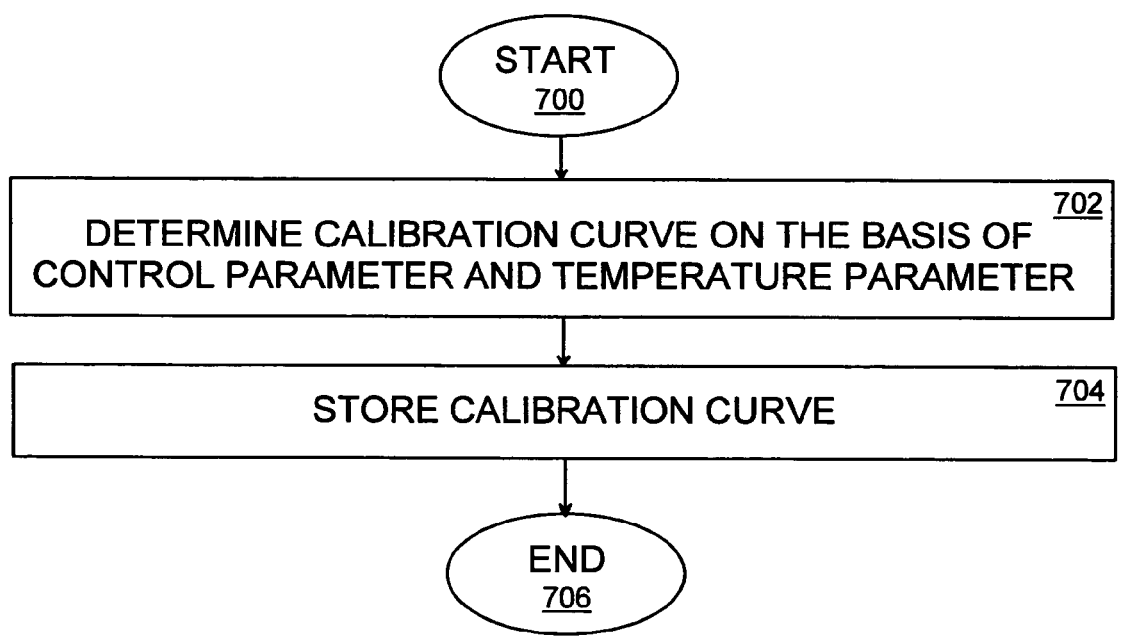
FIG. 7 illustrates a second example of a methodology according to an embodiment of the invention.
Figure 8:
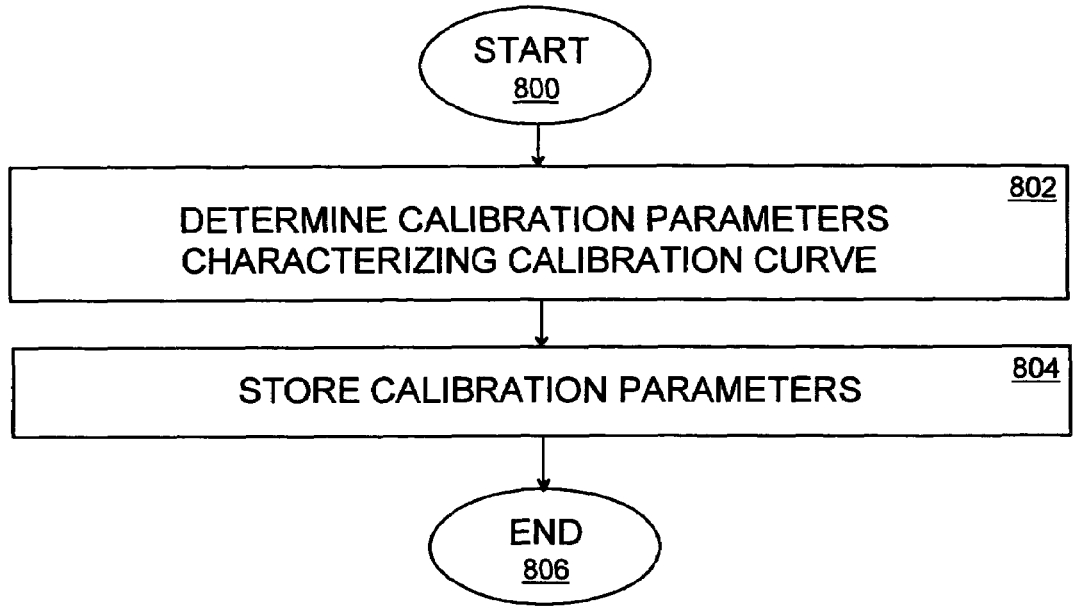
FIG. 8 illustrates a third example of a methodology according to an embodiment of the invention.

With reference to FIGS. 7 and 8, embodiments of the step of generating 608 the calibration information are shown.

In 700, the method starts.

In 702, a calibration curve 300 is determined on the basis of the control parameter 214 and the temperature parameter 218.

In 704, the calibration curve 300 is stored. In an embodiment of the invention, calibration points 304A to 304E of the calibration curve 300 are stored into an associative data structure.

In 706, the method ends.

With reference to FIG. 8, the method starts in 800.

In 802, calibration parameters characterizing the calibration curve 300 are determined.

In 804, the calibration parameters are stored.

In 806, the method ends.

Figure 9:
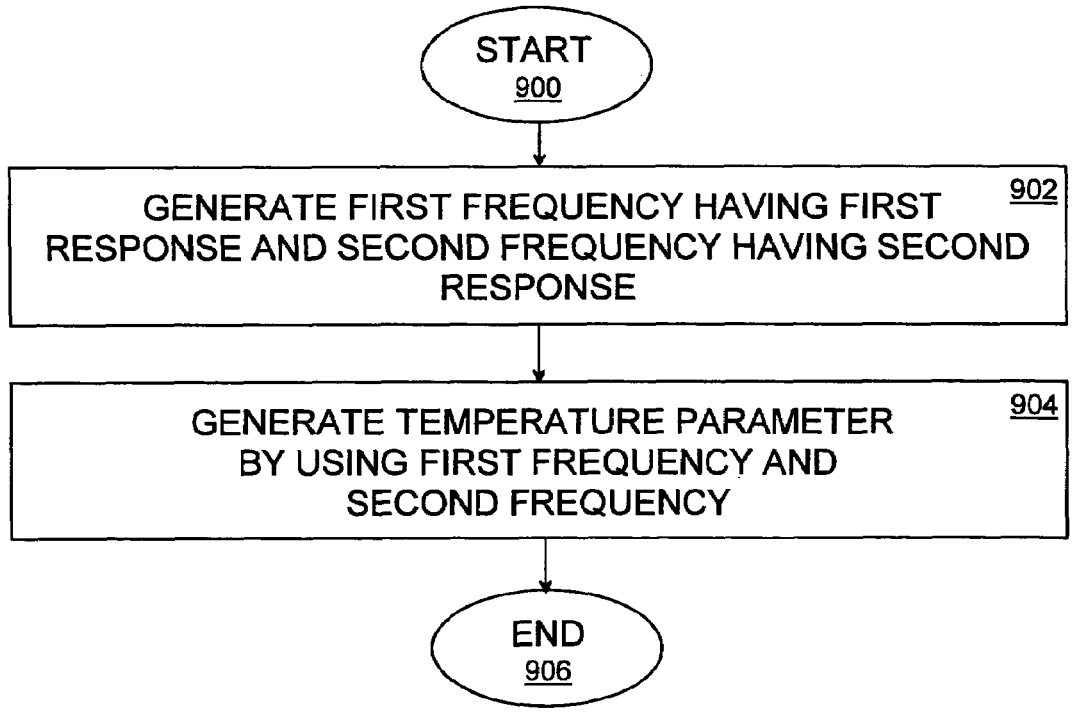
FIG. 9 illustrates another example of a methodology according to an embodiment of the invention.

With reference to FIG. 9, an embodiment of the step of measuring the temperature parameter 218 is illustrated.

In 900, the method starts.

In 902, a first frequency 412A and a second frequency 412B are generated simultaneously in the reference frequency generator 402 supplying a frequency reference 220 for the wireless telecommunication device 100, the first frequency 412A having a first response to the temperature of the reference frequency generator 402 and the second frequency 412B having a second response to the temperature of the reference frequency generator 402, the second response being different from the first response.

In 904, the temperature parameter 218 is generated by using the first frequency 412A and the second frequency 412B.

In 906, the method ends.

Parts of the methods shown in FIGS. 6, 7, 8 and 9 may be implemented with a computer program for frequency calibrating a wireless telecommunication device, wherein the computer program encoded instructions for executing a computer process in a digital processor. The computer program may be executed in the digital signal processor 108 and stored in the memory unit 110.

In an embodiment of the invention, the computer program may be comprised in a computer program product.

The computer program may be stored on a computer program distribution medium readable by a computer or a processor. The computer program medium may be, for example but not limited to, an electric, magnetic, optical, infrared or semiconductor system, or device. The medium may include at least one of the following media: a computer readable medium, a program storage medium, a record medium, a computer readable memory, a random access memory, an erasable programmable read-only memory, a computer readable software distribution package, and a computer readable compressed software package.

Even though the invention has been described above with reference to an example according to the accompanying drawings, it is clear that the invention is not restricted thereto but it can be modified in several ways within the scope of the appended claims.

The invention claimed is:

1. A wireless telecommunication device comprising:
a receiver configured to receive a reference radio signal of a wireless telecommunications system;
a reference frequency generator configured to generate a reference frequency for the wireless telecommunication device on the basis of a control parameter wherein the reference frequency generator is configured to generate a first frequency and a second frequency simultaneously, the first frequency having a first response to temperature of the reference frequency generator and the second frequency having a second response to temperature of the reference frequency generator, the second response being different from the first response;
a frequency synchronizer, connected to the receiver, configured to determine the control parameter in a calibration procedure by frequency synchronizing the wireless telecommunication device with the reference radio signal;
a temperature measurement unit configured to generate a temperature parameter characterizing the temperature of the reference frequency generator by using the first frequency and the second frequency; and
a calibration unit, connected to the temperature measurement unit, configured to generate calibration information comprising the control parameter determined by the frequency synchronizer and the temperature parameter associated with the control parameter and to store the calibration information in the calibration procedure, wherein the calibration unit is further configured to apply a control parameter associated with a current temperature parameter to the reference frequency generator after the calibration procedure.

2. The wireless telecommunication device of claim 1, wherein the calibration unit is further configured to determine a calibration curve on the basis of the control parameter and the temperature parameter and to store the calibration curve.

3. The wireless telecommunication device of claim 2, wherein the calibration unit comprises an associative array for storing calibration points of the calibration curve.

4. The wireless telecommunication device of claim 2, wherein the calibration unit is configured to determine calibration parameters characterizing the calibration curve and to store the calibration parameters.

5. The wireless telecommunication device of claim 1, wherein the calibration unit is configured to generate a temperature-compensated control parameter on the basis of the calibration information as a response to an input of a temperature parameter; and
wherein the reference frequency generator is configured to adjust the frequency reference on the basis of the temperature-compensated control parameter.

6. A device comprising:
receiving means for receiving a reference radio signal of a wireless telecommunications system;
frequency synchronizing means for determining, in a calibration procedure, a control parameter controlling a reference frequency generated by a reference frequency generator by frequency synchronizing the device with the reference radio signal wherein the reference frequency generator is configured to generate a first frequency and a second frequency simultaneously, the first frequency having a first response to temperature of the reference frequency generator and the second frequency having a second response to temperature of the reference frequency generator, the second response being different from the first response;

measuring means for generating a temperature parameter characterizing the temperature of the reference frequency generator by using the first frequency and the second frequency; and generating means for generating, in the calibration procedure, calibration information for calibrating the device, the calibration information comprising the determined control parameter and the temperature parameter associated with the control parameter, and for applying a control parameter associated with a current temperature parameter to the reference frequency generator after the calibration procedure.

7. A method comprising:

receiving, in a wireless telecommunication device, a reference radio signal of a wireless telecommunications system;

determining, in a calibration procedure, a control parameter controlling a reference frequency generated by a reference frequency generator by frequency synchronizing the wireless telecommunication device with the reference radio signal;

generating, in the reference frequency generator supplying a frequency reference for the wireless telecommunication device, a first frequency and a second frequency simultaneously, the first frequency having a first response to the temperature of the reference frequency generator and the second frequency having a second response to the temperature of the reference frequency generator, the second response being different from the first response;

generating a temperature parameter characterizing the temperature of the reference frequency generator by using the first frequency and the second frequency;

generating, in the calibration procedure, calibration information for calibrating the wireless telecommunication device, the calibration information comprising the determined control parameter and the temperature parameter associated with the control parameter; and applying a control parameter associated with a current temperature parameter to the reference frequency generator after the calibration procedure.

8. The method of claim 7, wherein generating the calibration information comprises:

determining a calibration curve on the basis of the control parameter and the temperature parameter; and storing the calibration curve.

9. The method of claim 8, wherein storing the calibration information comprises storing calibration points of the calibration curve into an associative data structure.

10. The method of claim 8, wherein generating the calibration information comprises:

determining calibration parameters characterizing the calibration curve; and storing the calibration parameters.

11. The method of claim 7, further comprising:

generating a temperature-compensated control parameter on the basis of the calibration information as a response to an input of a temperature parameter; and adjusting the frequency reference on the basis of the temperature-compensated control parameter.

12. A computer readable medium encoded with a computer program, the computer program encoding instructions for executing a computer process in a digital processor in a wireless telecommunication device, the computer process comprising:

determining, in a calibration procedure, a control parameter controlling a reference frequency generated by a reference frequency generator by frequency synchronizing the wireless telecommunication device with a received reference radio signal;

generating a first frequency and a second frequency simultaneously, the first frequency having a first response to the temperature of the reference frequency generator and the second frequency having a second response to the temperature of the reference frequency generator, the second response being different from the first response;

generating a temperature parameter characterizing the temperature of the reference frequency generator by using the first frequency and the second frequency;

generating, in the calibration procedure, calibration information for calibrating the wireless telecommunication device, the calibration information comprising the determined control parameter and the temperature parameter associated with the control parameter; and applying a control parameter associated with a current temperature parameter to the reference frequency generator after the calibration procedure.

* * * * *